United States Patent [19]

McCune

[11] Patent Number: 4,603,305

[45] Date of Patent: Jul. 29, 1986

[54] APPARATUS AND METHOD FOR SWEEP OSCILLATOR CALIBRATION

[75] Inventor: Earl McCune, Santa Clara, Calif.

[73] Assignee: Cushman Electronics, Inc., San Jose, Calif.

[21] Appl. No.: 634,145

[22] Filed: Jul. 24, 1984

[51] Int. Cl.$^4$ ............................................. H03B 23/00
[52] U.S. Cl. ................................. 331/4; 331/117 R; 331/177 V; 331/178
[58] Field of Search ................. 331/178, 4; 324/77 CS

[56] References Cited

U.S. PATENT DOCUMENTS

| | | | |
|---|---|---|---|
| 3,364,437 | 1/1968 | Loposer et al. | 331/1 A |
| 3,382,460 | 5/1968 | Blitz et al. | 331/178 |
| 3,530,399 | 9/1970 | Goggins, Jr. | 331/23 |
| 3,777,276 | 12/1973 | Klein | 331/4 |
| 4,349,789 | 9/1982 | Kurihara | 331/4 |
| 4,513,256 | 4/1985 | Kurihara et al. | 331/4 |

*Primary Examiner*—Siegfried H. Grimm
*Attorney, Agent, or Firm*—Fulwider, Patton, Rieber, Lee & Utecht

[57] ABSTRACT

A method and apparatus for generating a sweep signal, the frequency of which is accurately known at all times during the sweep cycle. The beginning and ending frequencies are fixed by a phase-locked loop and the resulting error correction voltages are stored. During the sweep, these error voltages determine the offset and slope of the D.C. voltage ramp signal which governs the frequency of the sweep oscillator.

15 Claims, 12 Drawing Figures

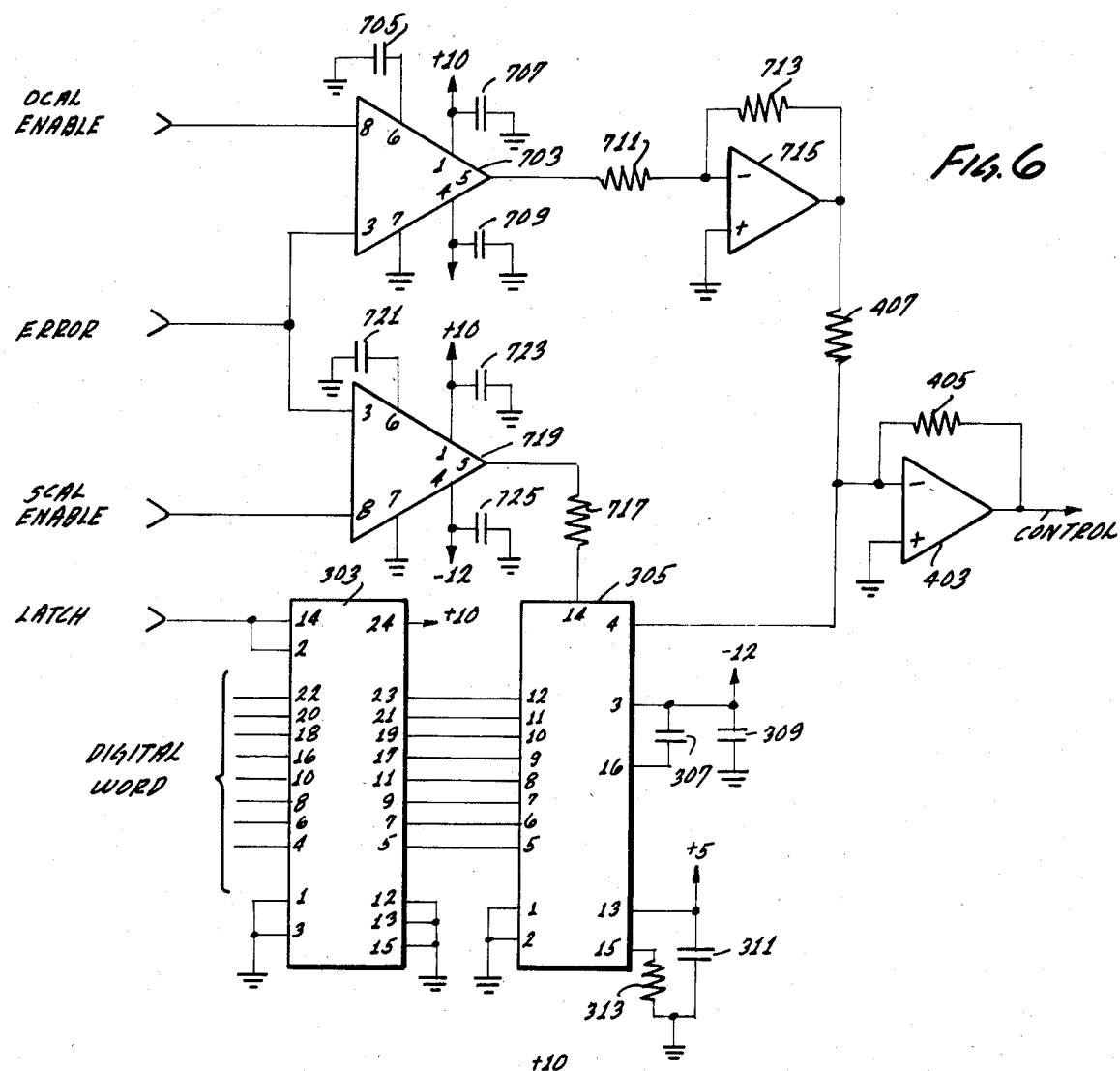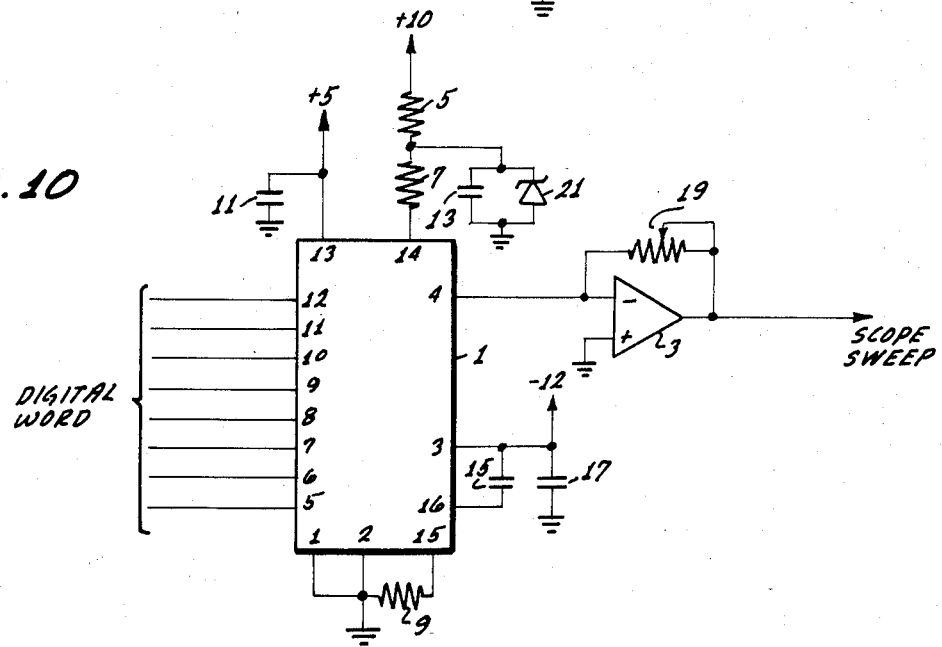

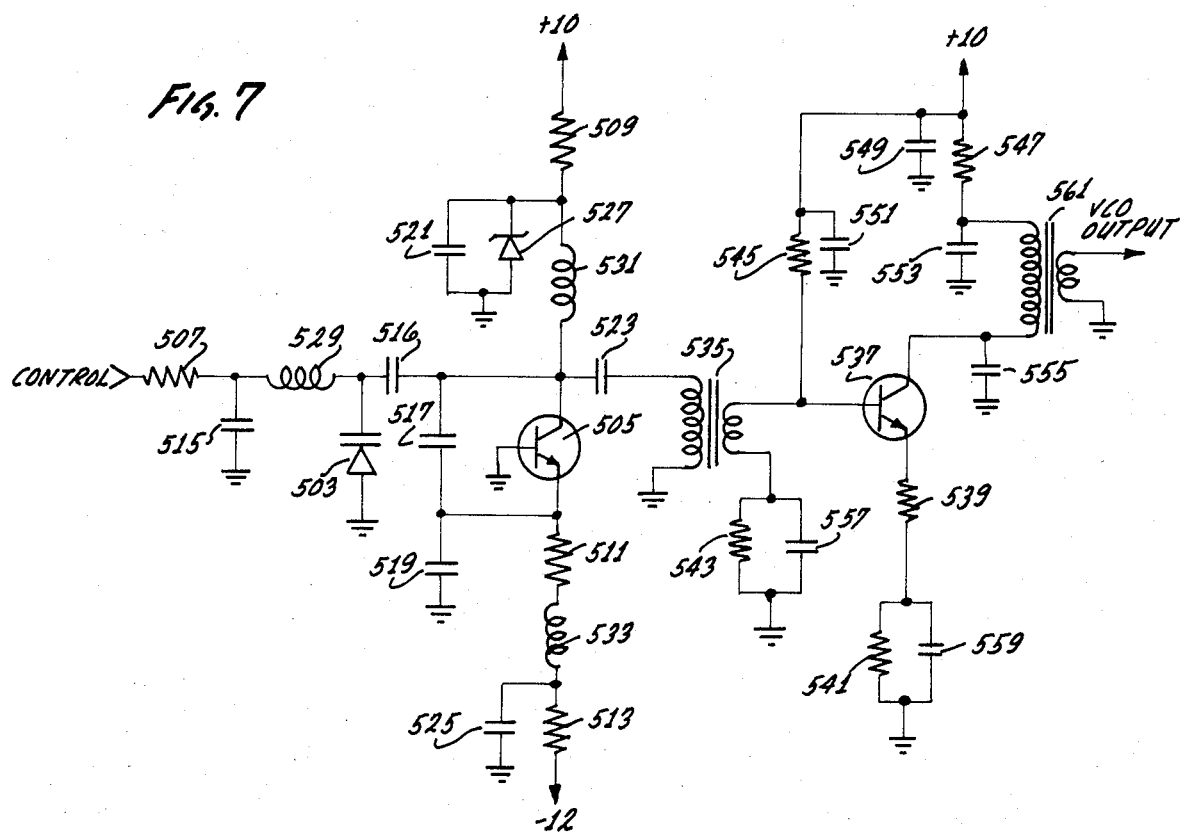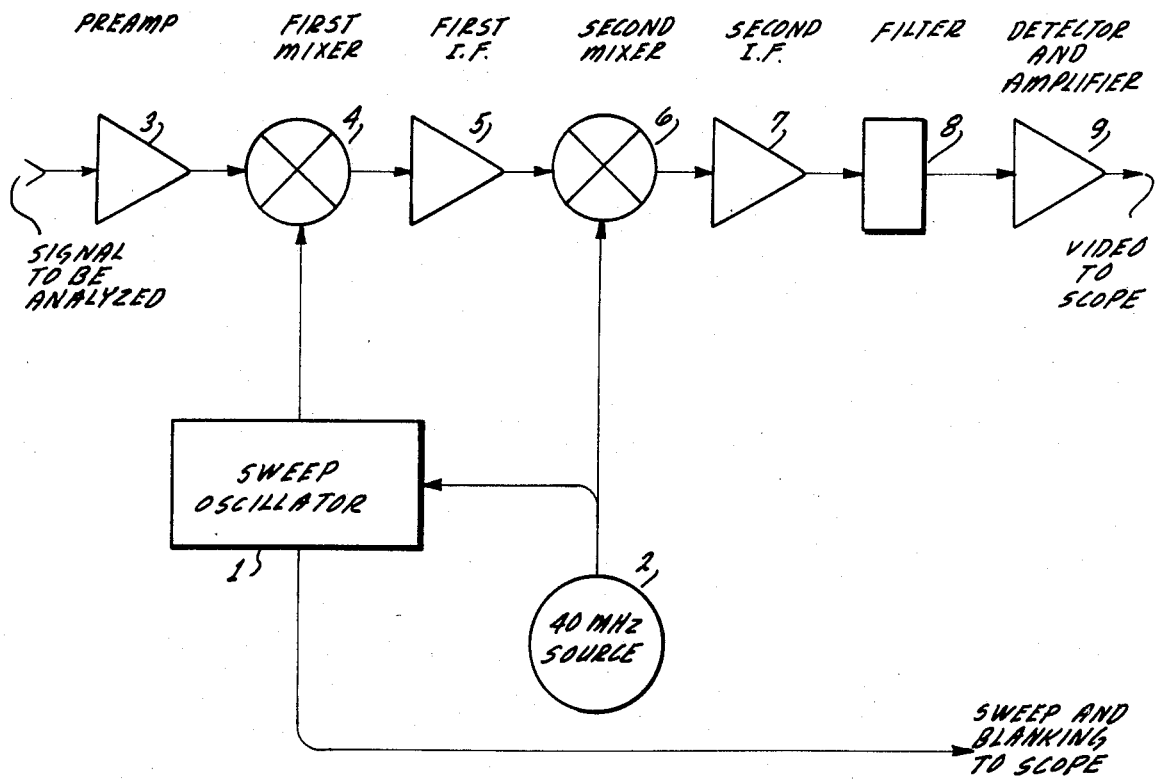

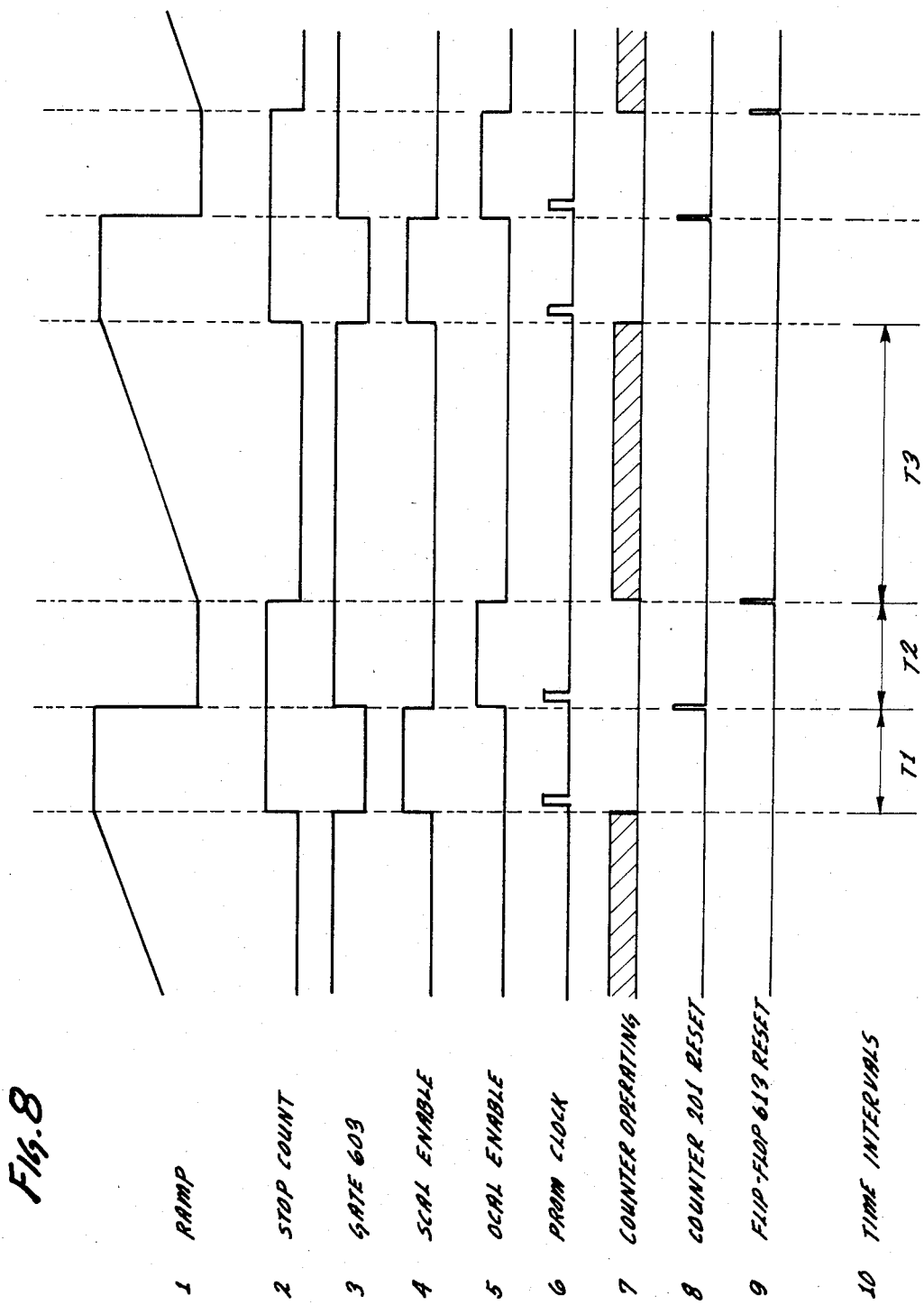

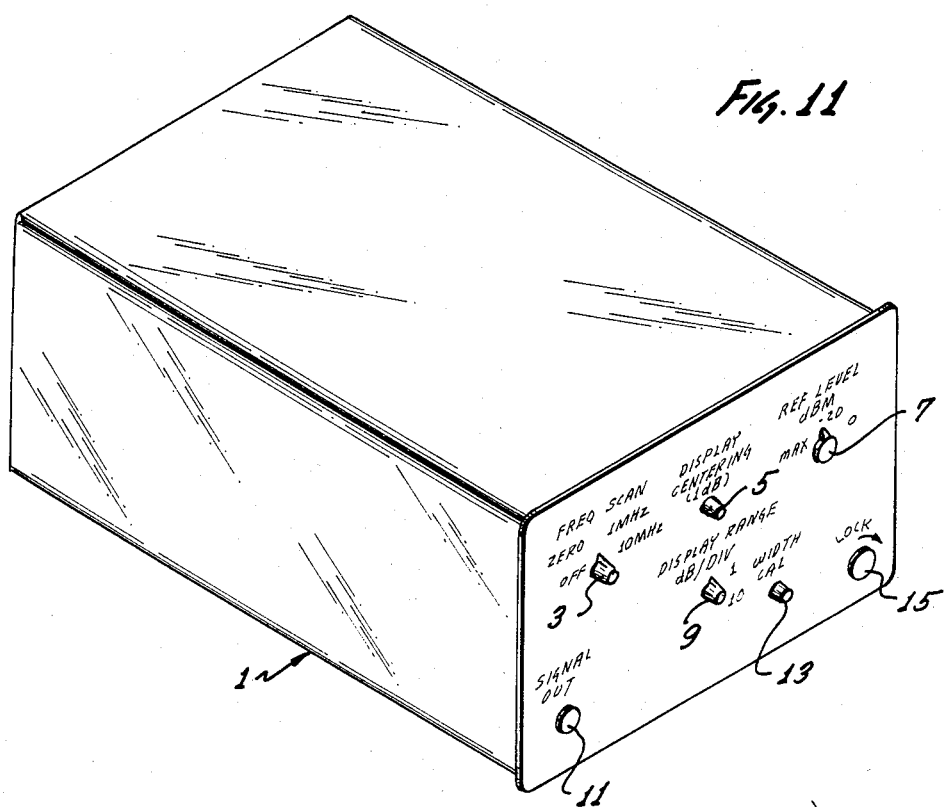
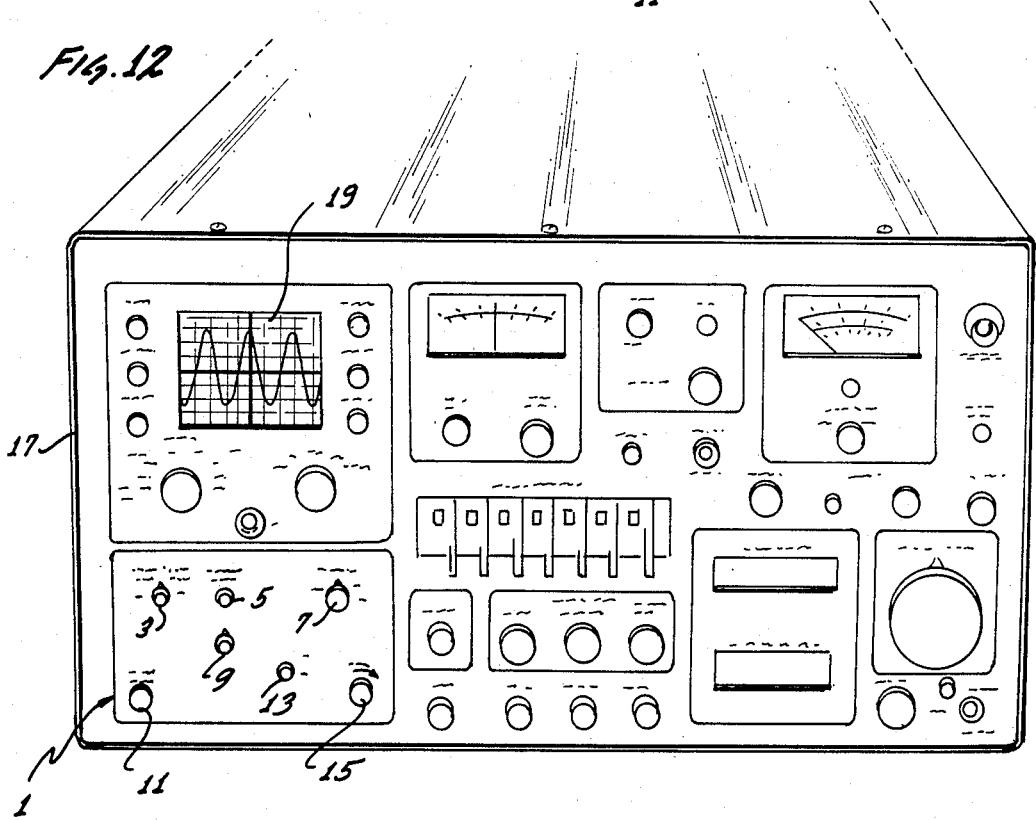

APPARATUS AND METHOD FOR SWEEP OSCILLATOR CALIBRATION

BACKGROUND OF THE INVENTION

1. Field of the Invention

This invention relates to the generation of alternating current signals, and more particularly to the generation of alternating current signals the frequency of which changes over time.

One common device for providing such a signal is the sweep oscillator. A sweep oscillator produces an alternating current signal, the frequency of which is initially low. The frequency increases as time passes, ending at a high final frequency. The sweep oscillator then reverts to the initial starting frequency and the process is repeated over and over.

There are many applications wherein an electrical signal consisting of an alternating current of changing frequency, such as is provided by a sweep oscillator, is needed. One such application is as the source of the reference frequencies in a frequency spectrum analyzer. The function of a spectrum analyzer is to determine the frequency or frequencies present in an unknown signal. Typically, the unknown signal will consist of a plurality of different frequencies mixed together, and it is the job of the spectrum analyzer to determine which frequencies are present in the unknown signal.

A spectrum analyzer works by electronically mixing, or heterodyning, a reference signal with the unknown signal. The output of said mixing process is a new signal with a frequency equal to the difference between the frequencies of the signals being mixed. This new signal is applied to a narrow band pass filter. The filter produces an output only if the input signal is of the same frequency as that to which the filter is tuned; signals of all other frequencies are blocked by the filter. The output from the filter is displayed on the screen of an oscilloscope (or some other viewing device). Thus, the oscilloscope will show the presence of a signal only if the signal present at the input to the filter is of the same frequency as the frequency to which the filter is tuned.

When the oscilloscope indcates the presence of an output from the filter, the frequency of the unknown input signal can be computed simply by adding the numerical value of the frequency of the reference signal to the value of the frequency to which the filter is tuned. By applying enough different reference signals to the mixer, and observing which reference frequencies result in an indication from the oscilloscope, it is possible to determine all of the different frequencies present in the unknown signal. However, the accuracy of this determination is limited by the precision with which the frequency of the reference signals is known.

In a spectrum analyzer, the reference signals are generated by a sweep generator. The swe generator generates all frequencies between its minimum and maximum many times per second. The accuracy of the output determination from the spectrum analyzer at any given instant of time will depend on how precisely the frequency being produced by the sweep generator at that instant is known.

The spectrum analyzer is but one of many applications which require a sweep generator the output of which is accurately known at all times during the sweep. Hence there is a need for a sweep oscillator, the output frequency of which is precisely known at all times during the sweep.

2. The Prior Art

Techniques for accurately controlling the frequency of a fixed-frequency oscillator are well known. Examples of such techniques include: the use of a crystal as the frequency determining element; the use of temperature stabilizing techniques in the oscillator circuit; the use of highprecision parts in the oscillator circuit; and the use of phase-locked loops.

Unfortunately, such techniques have not been sufficient to create a sweep oscillator of the accuracy needed. A crystal can only be used in a fixed-frequency oscillator. A phase-locked loop cannot change frequencies fast enough to generate a rapid sweep. High-precision parts and temperature stabilization techniques can be used in sweep oscillators, and they are so used but, by themselves, these methods are not enough to achieve the desired accuracy.

It is possible to accurately determine the frequency at any one point in the output of a sweep generator. One method is to use the output from an accurately calibrated fixed-frequency oscillator to fix the mid-frequency of the sweep oscillator. Another method is to superimpose the accurately calibrated output from a marker generator onto the unknown signal being analyzed. However, these methods provide precise knowledge of the output frequency of the sweep oscillator at only one, or at most a few, of the many output frequencies in the range of its sweep. Hence, the need for a sweep oscillator, the output frequency of which is precisely known at all times during the sweep, has not yet been satisfied.

BRIEF SUMMARY OF THE INVENTION

This invention is a method and apparatus for a sweep oscillator the output frequency of which is precisely know at all times during the sweep.

A linear D.C. voltage ramp is generated with a digital-to-analog ("D-to-A") converter. This ramp signal drives a voltage controlled oscillator ("VCO"). Before each sweep begins, the D-to-A converter is set to zero and the VCO is phase-locked with a fixed reference to the starting frequency by using a phase-locked loop ("PLL"). The correction voltage necessary to set the VCO to the correct starting frequency is termed the "offset calibration" error signal ("OCAL") and is stored in a sample-and-hold ("S/H") amplifier.

During the sweep, the PLL is broken and the D-to-A converter is clocked to full count. When full count is reached, phase-lock is re-acquired, thereby correcting the VCO output to the correct output frequency. The error signal necessary to accomplish this correction is termed the "slope calibration" error signal ("SCAL") and is stored in a second S/H amplifier. Then the entire cycle is repeated.

The OCAL and SCAL error signals together define a unique line. When this line is tracked by the ramp signal applied to the VCO, the VCO will generate the desired sweep output. The PLL locks the starting and ending frequencies very accurately, and the VCO tracks the slope of the ramp signal with high linearity. In this fashion, a sweep output the frequency of which is accurately known throughout its range of operation can be realized.

Other objects and advantages of this invention will be apparent to those skilled in the art upon a consideration of the description and drawings herein.

BRIEF DESCRIPTION OF THE DRAWINGS

FIG. 6 is a schematic diagram of digital-to-analog ("D-to-A") converter 301; sample and hold 701; and summing amplifier 401.

FIG. 7 is a schematic diagram of voltage controlled oscillator ("VCO") 501.

FIG. 8 is a timing diagram.

FIG. 9 is a block diagram of the invention as practiced in a spectrum analyzer.

FIG. 10 is a schematic diagram of the oscilloscope sweep generator used in the spectrum analyzer.

FIG. 11 is a view of the control panel of the spectrum analyzer.

FIG. 12 is a view of the spectrum analyzer installed in a test set.

DESCRIPTION OF THE PREFERRED EMBODIMENT

Figure 1:
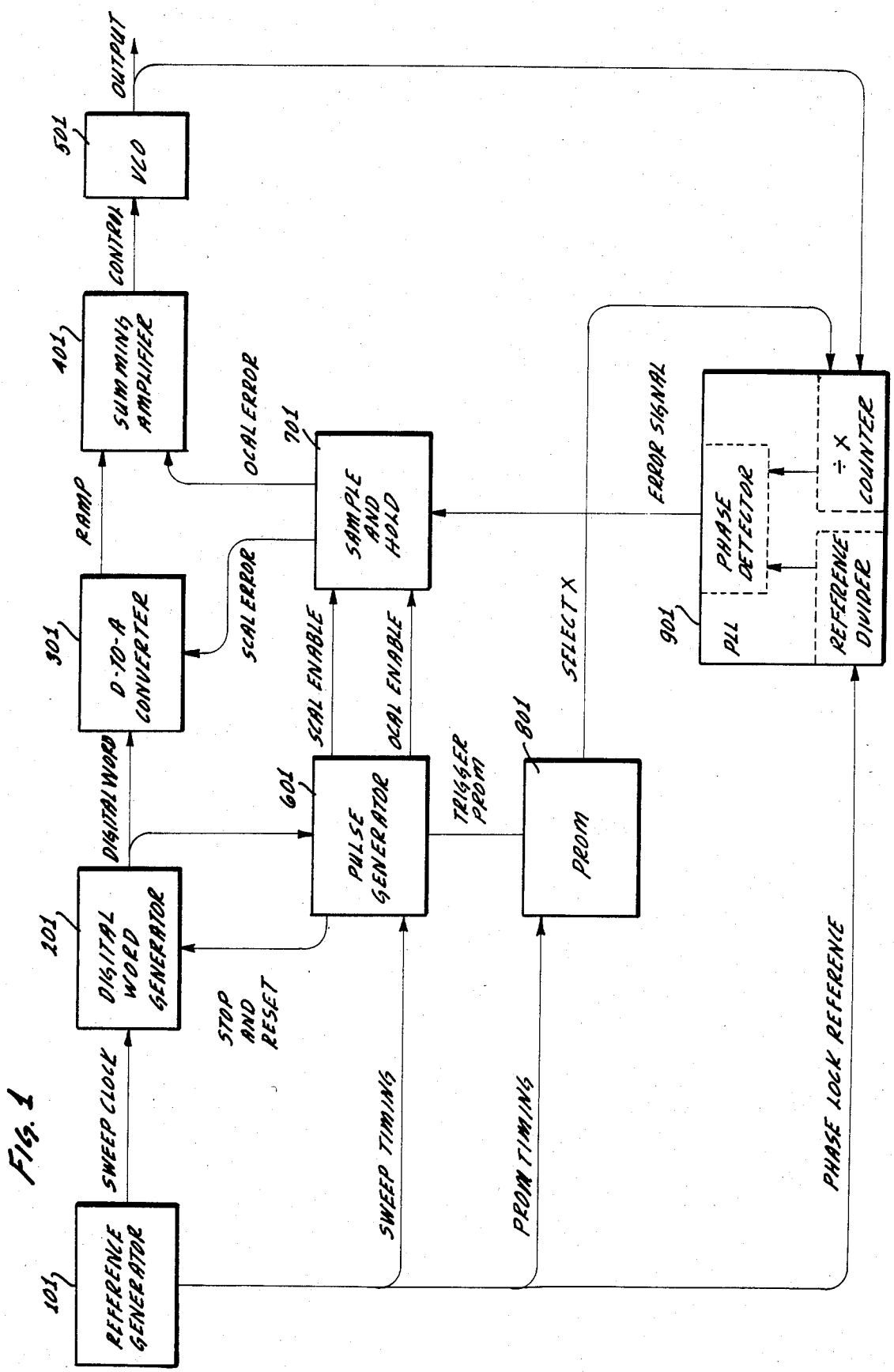
FIG. 1 is a block diagram of the invention.

In FIG. 1, reference generator 101 is a source of fixed-frequency reference signals. Its sweep clock output is applied to digital word generator 201. Word generator 201 is a parallel output counter, the output of which is a digital word. This digital word is applied to D-to-A converter 301. The output of converter 301 is a D.C. voltage ramp which increases linearly as the digital word counts up an which returns to its initial value when the digital word is reset from maximum count to zero count.

The ramp signal passes through summing amplifier 401 to VCO 501. The output of VCO 501 is a sine wave, the frequency of which varies linearly in proportion to the magnitude of the ramp signal.

A portion of the output of VCO 501 is fed back to phase-locked loop ("PLL") 901. When the digital word is at zero count, the ramp is at its minimum value and VCO 501 is generating its minimum output frequency. PROM 801 applies a select-X control signal to the divide-by-X counter contained within PLL 901. This select-X signal set the divide-by-X counter such that when the output of VCO 501 is precisely on the desired minimum frequency, the output of the divide-by-X counter is equal to the output of the reference divider also contained within PLL 901.

If VCO 501 starts to drift, PLL 901 generates an error signal. This error signal is strobed by the OCAL enable pulse into sample-and-hold ("S/H") 701, where it is held as the OCAL error signal. The OCAL error signal is combined with the ramp in summing amplifier 401, raising or lowering the level of the ramp so as to bring the output of VCO 501 back to the desired frequency.

When the digital word reaches its maximum count, PROM 801 applies another select-X control signal to the divide-by-X counter in PLL 901; this new select-X signal sets the divide-by-X counter such that when the output of VCO 501 is precisely on the desired maximum frequency, the output of the divide-by-X counter is equal to the output of the reference divider also contained within PLL 901.

If VCO 501 starts to drift, PLL 901 generates an error signal. This error signal is strobed by the SCAL enable pulse into sample-and-hold ("S/H") 701, where it is held as the SCAL error signal. The SCAL error signal scales the ramp amplitude in converter 301, raising or lowering the slope of the ramp so as to bring the output of VCO 501 back to the desired frequency.

From the preceding discussion, it will be apparent that the circuit operates as a phase-locked loop twice during each sweep cycle: once, when the digital word is at zero count; and again, when the digital word is at maximum count. At that point in each sweep cycle when the digital word is at zero count, the level of the ramp is adjusted up or down as needed by the OCAL error signal to cause the VCO to generate the exact minimum frequency desired. At that point in each sweep cycle, when the digital word is at maximum count, the slope of the ramp is adjusted up or down as needed by the SCAL error signal to cause the VCO to generate the exact maximum frequency desired.

At all other times the loop is broken. The ramp signal, generated by digital word generator 201 and converter 301, is continuously increasing; the origin and slope of the ramp are determined by the OCAL and SCAL error signals as held in S/H 701; and VCO 501 produces an output frequency which at any given instant is precisely proportional to the magnitude of the ramp.

In this fashion, the sep oscillator is very accurately calibrated at the beginning and end of each sweep cycle. In between the beginning and end of each sweep cycle, the ramp is a linearly changing D.C. voltage, and since the output of the VCO is linearly proportional to that voltage, the output frequency of the circuit is precisely known at all times during the sweep cycle.

Figure 2:
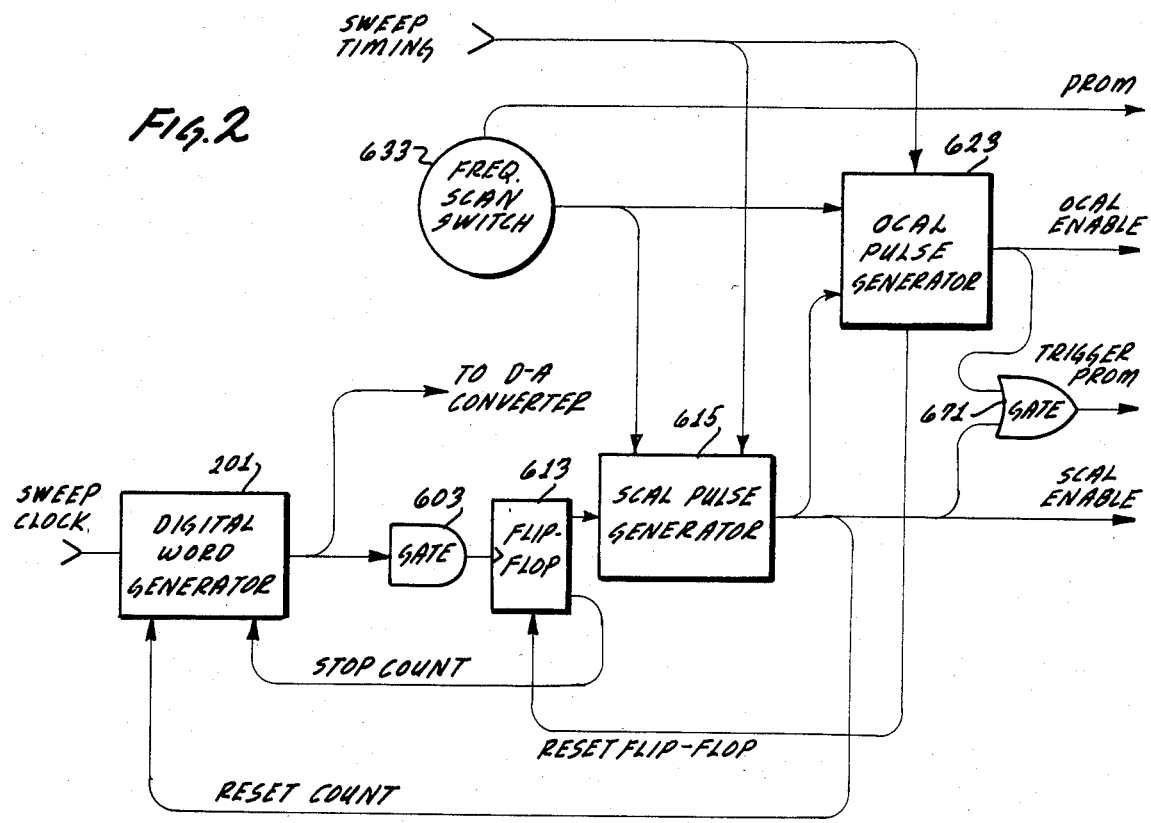
FIG. 2 is a block diagram of pulse generator 601.

Pulse generator 601 is shown in more detail in FIG. 2. The output of digital word generator 201 is applied to gate 603. Gate 603 has a zero output at all times until the digital word is at maximum count, at which time the output of gate 603 goes HI. The HI output of gate 603 sets flip-flop 613, immediately stopping the digital word generator and causing SCAL pulse generator 615 to generate an "SCAL enable" signal. During the time the SCAL enable signal is HI, the SCAL error signal is generated. When the SCAL enable signal goes LO, the digital word generator is reset to zero count. Because flip-flop 613 is still set, the count remains stopped. OCAL pulse generator 623 generates an "OCAL enable" HI signal during which the OCAL error signal is generated. At the conclusion of the OCAL enable signal, flip-flop 613 is reset and the counter resumes operation. When the counter has reached full count, gate 603 again produces a HI output and the cycle repeats.

PROM 801 generates select-X signal at the start of SCAL enable and again at the start of OCAL enable. This is done by applying both SCAL and OCAL enable signals through gate 671 to PROM 801.

The minimum and maximum frequencies generated by VCO 501 are controlled by PLL 901. The actual value of the minimum frequency is fixed by the number used for the lower value of "X" in the divide-by-X counter in PLL 901, and the maximum frequency is likewise fixed by the number used for the upper value of "X". These minimum and maximum frequencies can be changed at will simply by changing the lower and upper values of "X". It is the function of frequency scan switch 633 to change these values of "X" and thereby to control the range of sweep frequencies produced.

Figure 3:
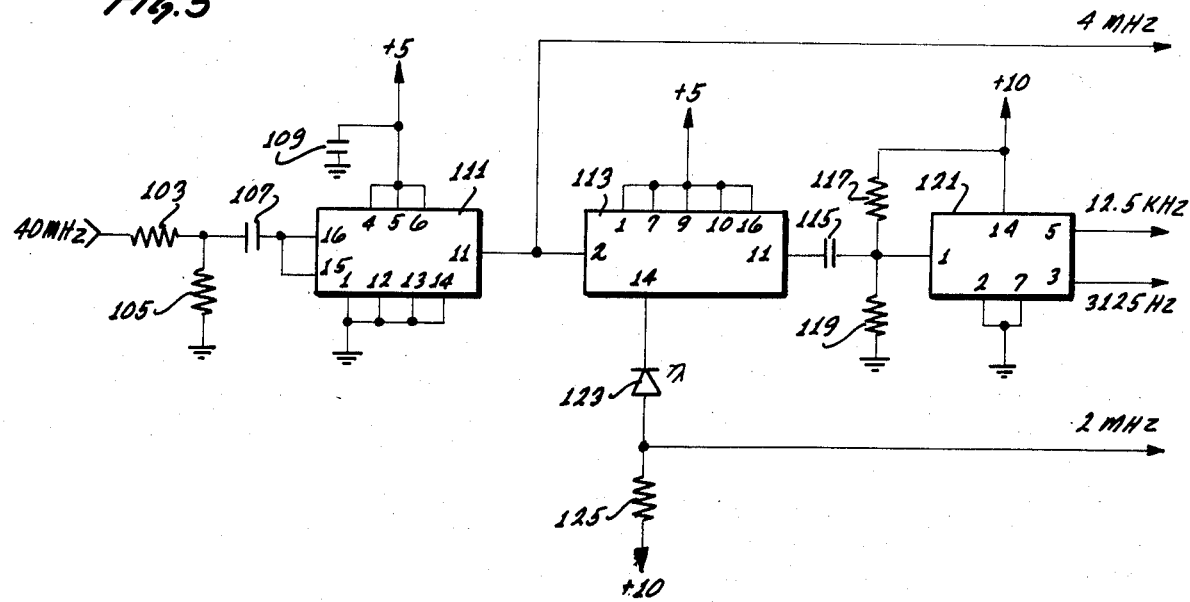
FIG. 3 is a schematic diagram of reference generator 101.
Figure 4:
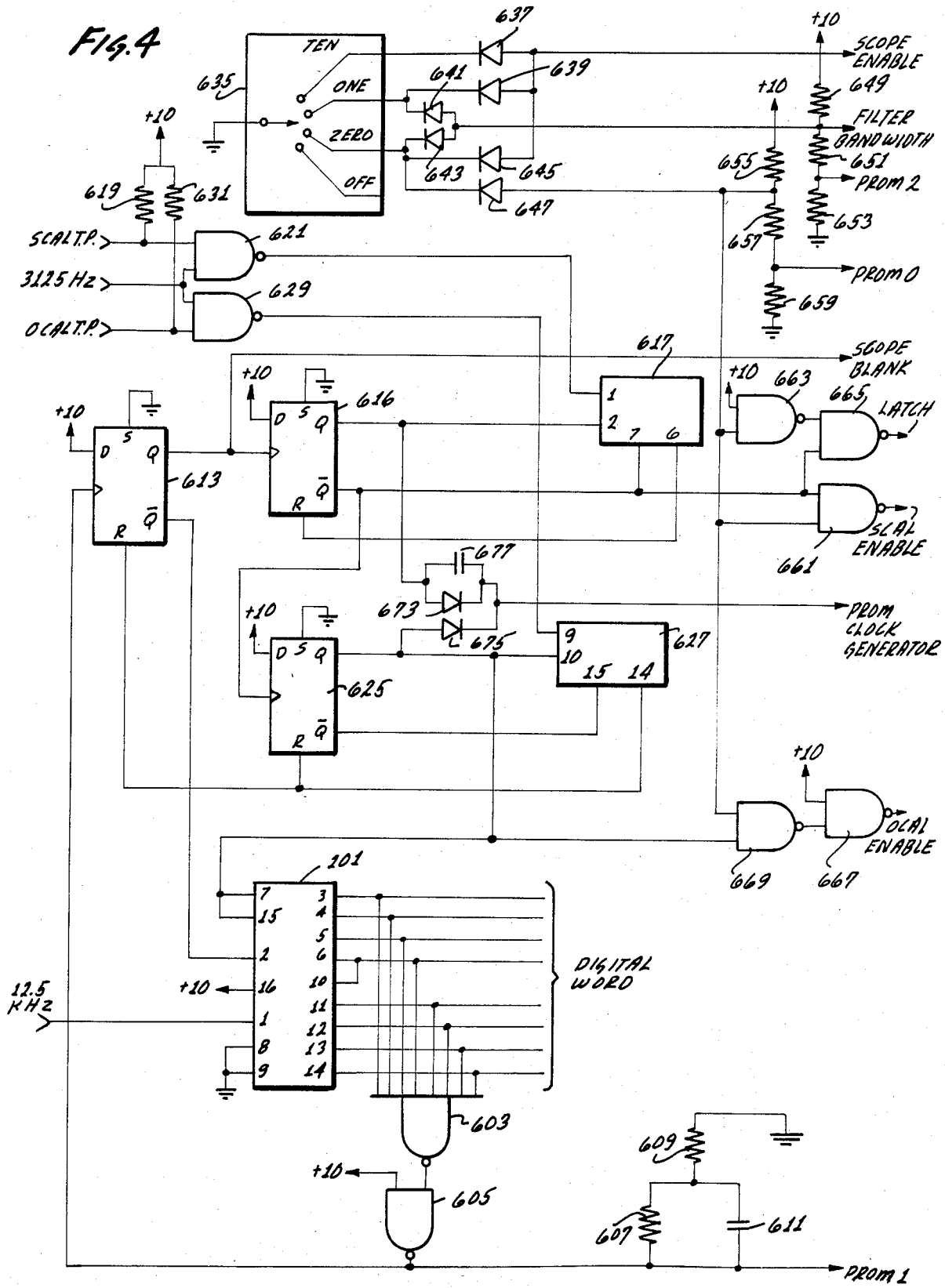
FIG. 4 is a schematic diagram of pulse generator 601 and digital word generator 201.

The circuitry of reference generator 101 is shown in FIG. 3. The 40 MHz input is derived from a crystal controlled or other highly stable oscillator. The input is reduced to 4 MHz by counter 111 (type 11C90), and to the other control frequencies by counters 113 (type 74HC160) and 121 (type 4024). In FIG. 4, the circuitry of digital word generator 201 (for which I have used a type 4520 counter) and pulse generator 601 are illustrated.

In circuit operation, when the digital word reaches maximum count, flip-flop 613 is set, causing its Q-bar output to go LO and stop counter 201. At the same time, the Q output of flip-flop 613 goes HI.

The SCAL pulse generator circuit, shown as block 615 in FIG. 2, includes flip-flop 616 and counter 617 (type 4520). When the Q signal from flip-flop 613 goes HI, it causes the Q output of flip-flop 616 to go HI as well, enabling counter 617. At the same time, the Q-bar output of flip-flop 616, through gate 661, becomes the SCAL enable pulse. When counter 617 reaches its maximum count, it resets flip-flop 616, thereby causing the SCAL enable pulse to end. The input frequency applied to counter 617 determines the duration of the SCAL enable pulse. A LO signal applied SCAL T.P. will cause the SCAL enable pulse to remain HI; this is only done during system testing.

The OCAL pulse generator, shown as block 623 in FIG. 2, includes flip-flop 625 and counter 627 (type 4520). The Q output of flip-flop 625 is set HI when the Q-bar output of flip-flop 616 goes HI at the end of the SCAL pulse. This event resets counter 201 to zero count; since flip-flop 613 is still set, the count is still stopped. Counter 627 runs to its maximum count, during which the OCAL enable output of gate 667 is HI. The duration of the OCAL enable pulse is determined by the input frequency to counter 627. When counter 627 reaches maximum count, it resets flip-flops 625 and 613, and counter 201 resumes counting.

Frequency scan switch 633 in FIG. 2 includes switch 635 and diodes 637 through 647. If the switch is set for zero dispersion (no sweep), it disables the OCAL pulse; forces the SCAL pulse; and enables the latch pulse, which is applied to latch 303 of FIG. 6.

Figure 5:
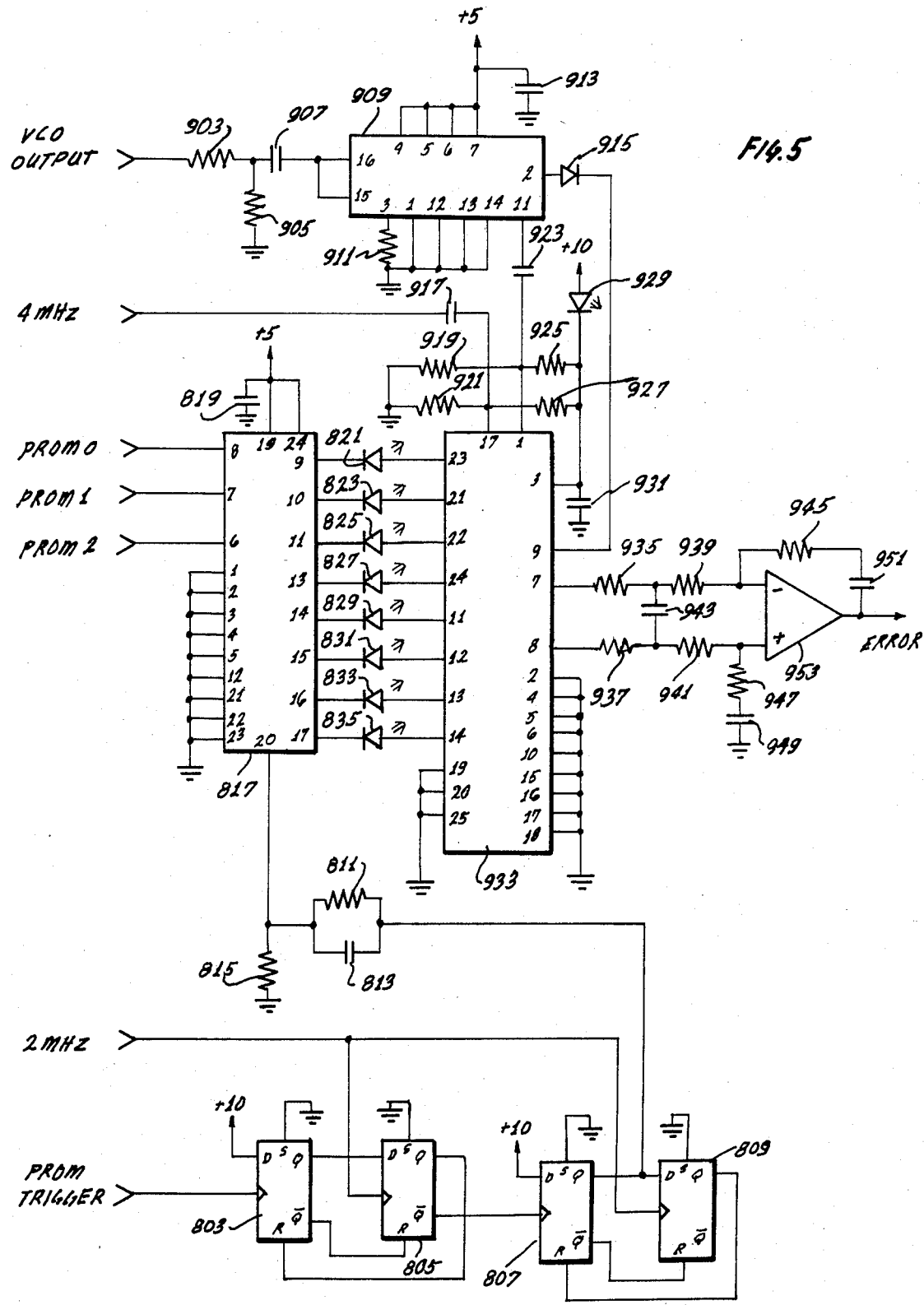
FIG. 5 is a schematic diagram of PROM 801 and PLL 901.

In FIG. 5, the circuits of the PROM 801 and PLL 901 blocks are illustrated. Flip-flops 803, 805, 807, and 809 generate a short clock pulse when either SCAL or OCAL enable goes HI. The clock pulse is applied to PROM IC 817 (a type IM6654), causing it to change its outputs according to the signals then present at inputs PROM 0, PROM 1, and PROM 2.

The outputs of PROM IC 817, which are applied to PLL controller 933 (type MC145152), set the desired value of "X" into the divide-by-X counter. The divide-by-X counter consists of (a) the dual modulus counter contained within controller 933 and (b) counter 909 (type 11C90), the modulus of which is controlled by the signal from pin 9 of controller 933. The output of the phase detector contained within controller 933 is filtered by amplifier 953 and its associated resistors and capacitors 935 through 951 to become the error signal.

FIG. 6 shows the circuitry of sample and hold block 701, of D-to-A converter 301, and of summing amplifier 401.

The error signal present at the output of phase detector 901 at an given instant of time will be either the SCAL or the OCAL error signal. When the SCAL enable pulse is HI, the error signal is the SCAL error signal, and it is passed through SCAL sample and hold amplifier 719. When the OCAL enable pulse is HI, the error signal is the OCAL error signal, and it is passed through OCAL sample and hold amplifier 703. When the enable input of either amplifier is LO, the output is held at the value it had while the enable input was last HI.

The SCAL error signal is applied to DA converter 305 through pin 14, thereby correcting the slope of the ramp. The OCAL error signal is applied to summing amplifier 403, where it is summed with the ramp current output from pin 4 of DA converter 305, thereby correcting the origin of the ramp. The output of amplifier 403 is designated the "control" signal in FIG. 6 and in FIG. 1.

Latch 303 (type MC4508) is not used during generation of the sweep signal; a continuous HI is applied to its input pins 2 and 14, causing it to pass the digital word through to DA converter 305 (type MC1408). Latch 303 is used if it is desired to disable the sweep function and cause VCO 501 to generate a fixed output frequency. Because the oscilloscope sweep must be synchronized with the sweep output of VCO 501, the same digital word which is used to generate the ramp which controls VCO 501 is also used to generate the sweep signal for the oscilloscope. However, even when VCO 501 is generating a fixed output frequency, the oscilloscope sweep is still needed. Thus generation of the digital word must continue whether or not VCO 501 is producing a sweep output. When frequency scan switch 633 is set for zero dispersion, latch 303 blocks the digital word from DA converter 305 and thereby allows the oscilloscope sweep to continue uninterrupted even though VCO 501 is being operated as a fixed-frequency, phase-locked oscillator.

Voltage-controlled oscillator 501 is shown schematically in FIG. 7. The control signal is applied across varactor 503, through which the frequency of the oscillator (transistor 505 and its related components) is controlled. The output of the oscillator is coupled through transformer 535 to the buffer amplifier (transistor 537 and its related components) which isolates the output load and feedback loop from the oscillator.

A timing diagram, showing the relationships among the control pulses, is set forth in FIG. 8. Line 1 shows the ramp signal. Lines 2, 3, 4 and 5 correspond with signals in FIG. 2. Line 6 is the input to pin 20 of PROM 817 in Fig. 5. Line 7 shows when counter 203 in FIG. 4 is operating. Lines 8 and 9 illustrate the precise moment when the indicated reset takes place.

Many different ranges and rates of sweep can be realized by changing the variables in this circuit. I have generated a 10 MHz sweep range of 67 to 77 MHz with a repetition rate of 39 sweeps per second by using the following values:

| Sweep clock: | 12.5 KHz |
| Sweep timing: | 3125 Hz |
| Phase-lock reference: | 4 MHz |
| Reference divider: | 8 |
| "X" | 134 and 154 |
| Ramp: | 4.96 to 6.39 volts |
| VCO center frequency: | 72 MHz |

With these values, intervals T1 and T2 in FIG. 8 are each 2.56 milliseconds and T3 is 20.48 milliseconds. By changing "X" to 143 and 145, the sweep range is reduced to 1 MHz; all other values remain the same.

It will be apparent that many other values could be selected for the variables so as to give other sweep ranges and rates. Also, the VCO can be modified so that its center frequency is different. Likewise, there are many different variations of components and interconnections of components which will function equaly well as the particular components and interconnections thereof disclosed herein. None of these changes affect the principles of operation of my invention.

FIG. 9 is a block diagram of a spectrum analyzer which incorporates the sweep oscillator circuit as block 1. The signal to be analyzed has been pre-processed such that it has a center frequency of 10.7 MHz. After initial amplification in preamp 3, the signal to be analyzed is subtracted from the output of sweep oscillator 1 in mixer 4. Since the center frequency of sweep oscillator 1 is 72 MHz, the center frequency of the mixer output is 61.3 MHz. This signal is amplified in I.F. amplifier 5 and the 40 MHz reference is subtracted from it in mixer 6, yielding a signal with a center frequency of 21.3 MHz. This 21.3 MHz signal is further processed by amplifier 7, filter 8, and detector and amplifier 9. The output of the spectrum analyzer is applied to an oscilloscope for visual display.

FIG. 10 shows the circuit which is used in the spectrum analyzer to generate the sweep for the oscilloscope from the digital word.

FIG. 11 shows the physical control panel of the spectrum analyzer 1, including frequency scan switch 3, other controls 5, 7, 9 and 13, auxiliary signal output 11, and locking clip 15 for securing the spectrum analyzer within a test set.

FIG. 12 shows the spectrum analyzer 1, as illustrated in FIG. 11, installed in a complete radio test set 17, along with oscilloscope screen 19 which displays the output of the spectrum analyzer. Having thusly described the invention,

I claim:

1. Sweep oscillator apparatus comprising:
   a voltage controlled oscillator;
   a variable modulus divider, the input to which divider is connected to the output of said voltage controlled oscillator;
   a reference signal;
   a phase detector, one input of which is connected to said reference signal and the other input of which is connected to the output of said variable modulus divider;
   control voltage generating means, the output of which changes linearly with time from an initial value to a final value, then reverts to its initial value, which output is connected to the control input to the voltage controlled oscillator;
   a pulse generator which generates a slope strobe signal when the control voltage reaches its final value and which generates an offset strobe signal when the control voltage reaches its initial value;
   offset selector means activated by the offset strobe signal and connected to the variable modulus divider, which selector means fixes the modulus of the variable modulus divider to that number which will cause the phase detector to give a null output when the voltage controlled oscillator is generating the desired minimum frequency;
   slope selector means activated by the slope strobe signal and connected to the variable modulus divider, which selector mean fixes the modulus of the variable modulus divider to that number which will cause the phase detector to give a null output when the voltage controlled oscillator is generating the desired maximum frequency;
   offset storage means connected to the error output from said phase detector, which storage means stores the error output signal when strobed by the offset strobe signal;
   slope storage means connected to the error output from said phase detector, which storage means stores the error output signal when strobed by the slope strobe signal;
   correcting means, connected to the control voltage generating means and to the offset storage means, which correcting means changes the initial value of the control voltage in accordance with the offset error signal output from the offset storage means so as to correct the output frequency of the voltage controlled oscillator to the desired minimum frequency at the time the control voltage is at its initial value; and
   correcting means, connected to the control voltage generating means and to the slope storage means, which correcting means changes the rate of change with time of the control voltage in accordance with the slope error signal output from the slope storage means so as to correct the output fequency of the voltage controlled oscillator to the desired maximum frequency at the time the control voltage is at its final value.

2. Apparatus according to claim 6 wherein:
   the offset selector means is manually controllable such that the operator can select the modulus to be fixed when the offset strobe signal activates said offset selector means; and
   the slope selector means is manually controllable such that the operator can select the modulus to be fixed when the slope strobe signal activates said slope selector means.

3. Sweep oscillator apparatus comprising:
   a voltage controlled oscillator;
   a variable modulus divider, the input to which divider is connected to the output of said voltage controlled oscillator;
   a reference signal generator;
   a phase detector, one input of which is connected to the output of said reference signal generator and the other input of which is connected to the output of said variable modulus divider;
   a digital word generator, the input of which is connected to the output of said reference signal generator;
   a digital-to-analog converter, the binary inputs of which are connected to the output of said digital word generator;
   a pulse generator, connected to the output of said digital word generator, which pulse generator generates a slope strobe signal when the digital word reaches its final value and which generates an offset strobe signal when the digital word reaches its intial value;
   offset selector means connected to said pulse generator and to the variable modulus divider, which selector means is activated by the offset strobe signal and which, upon said activation, fixes the modulus of the variable modulus divider to that number which will cause the phase detector to give a null output when the voltage controlled oscillator is generating the desired minimum frequency;

slope selector means connected to said pulse generator and to the variable modulus divider, which selector means is activated by the slope strobe signal and which, upon said activation, fixes the modulus of the variable modulus divider to that number which will cause the phase detector to give a null output when the voltage controlled oscillator is generating the desired maximum frequency;

an offset sample-and-hold connected to the error output from said phase detector, which sample-and-hold stores the error output signal when strobed by the offset strobe signal;

a slope sample-and-hold connected to the error output from said phase detector, which sample-and-hold stores the error output signal when strobed by the slope strobe signal, and the output of which is applied as a reference input to said digital-to-analog converter; and a summing amplifier, connected to the output from the digital-to-analog converter and to the output from the offset sample-and-hold, the output of which summing amplifier is applied to the control input of the voltage controlled oscillator.

4. Apparatus according to claim 3 wherein:

the offset selector means is manually controllable such that the operator can select the modulus to be fixed when the offset strobe signal activates said offset selector means; and the slope selector means is manually controllable such that the operator can select the modulus to be fixed when the slope strobe signal activates said slope selector means.

5. A sweep oscillator comprising:

a ramp generator responsive to a slope correction signal to provide a ramp signal that varies between an initial value and a final value at periodic intervals, the ramp signal having a slope determined by said slope correction signal;

summing means operative to add an offset correction signal to the ramp signal to provide an oscillator control signal;

an oscillator responsive to the oscillator control signal to provide an output signal having a frequency determined by said oscillator control signal;

modulus control means to provide initial and final modulus control signals corresponding, respectively, to the initial and final value of the ramp signal;

a phase-locked loop, responsive to the initial modulus control signal and to the output signal to provide an offset correction signal having a value indicative of any difference between the frequency of said output signal and a first predetermined frequency, and further responsive to the final modulus control signal and to said output signal to provide a slope correction signal having a value indicative of any difference between the frequency of said output signal and a second predetermined frequency;

offset storage means, operative to apply the offset correction signal to the summing means when the ramp signal assumes its initial value whereby the oscillator control signal is caused to shift the frequency of the output signal toward the first predetermined frequency, and further operative when the ramp signal begins to change from its initial value towards its final value to store the value of the offset correction signal then being provided by the phase-locked loop and then to apply said stored offset correction signal value to the summing means; and slope storage means, operative to apply the slope correction signal to the ramp generator when the ramp signal assumes its final value whereby the oscillator control signal is caused to shift the frequency of the output signal toward a second predetermined value, and further operative when the ramp signal begins to change from its final value back to its initial value to store the value of the slope correction signal then being provided by the detector means and then to apply said stored slope correction signal value to the ramp generator.

6. A sweep oscillator comprising:

a timing means;

a ramp generator responsive to the timing means and to a slope correction signal to provide a ramp signal that varies between an initial value and a final value at periodic intervals determined by the timing means, the ramp signal having a slope determined by said slope correction signal;

summing means operative to add an offset correction signal to the ramp signal to provide an oscillator control signal;

an oscillator responsive to the oscillator control signal to provide an output signal having a frequency determined by said oscillator control signal;

modulus control means responsive to the timing means to provide initial and final modulus control signals corresponding, respectively, to the initial an final values of the ramp signal;

a phase-locked loop, responsive to the initial modulus control signal and to the output signal to provide an offset set correction signal having a value indicative of any difference between the frequency of said output signal and a first predetermined frequency, and further responsive to the final modulus control signal and to said output signal to provide a slope correction signal having a value indicative of any difference between the frequency of said output signal and a second predetermined frequency;

offset storage means, operative to apply the offset correction signal to the summing means when the ramp signal assumes its initial value whereby the oscillator control signal is caused to shift the frequency of the output signal toward the first predetermined frequency, and further operative when the ramp signal begins to change from its initial value towards its final value to store the value of the offset correction signal then being provided by the phase-locked loop and then to apply said stored offset correction signal value to the summing means; and slope storage means, operative to apply the slope correction signal to the ramp generator when the ramp signal assumes its final value whereby the oscillator control signal is caused to shift the frequency of the output signal toward a second predetermined value, and further operative when the ramp signal begins to change from its final value back to its initial value to store the value of the slope correction signal then being provided by the detector means and then to apply said stored slope correction signal value to the ramp generator.

7. A sweep oscillator according to claim 6 and further comprising means for an operator to manually select the first and second predetermined frequencies.

8. A sweep oscillator comprising:
a ramp generator responsive to a slope correction signal to provide a ramp signal that varies between an initial value and a final value at periodic intervals, the ramp signal having a slope determined by said slope correction signal;
summing means operative to add an offset correction signal to the ramp signal to provide an oscillator control signal;
an oscillator responsive to the oscillator control signal to provide an output signal having a frequency determined by said oscillator control signal;
modulus control means to provide initial and final modulus control signals corresponding, respectively, to the initial and final values of the ramp signal;
a variable-modulus frequency divider responsive to the initial modulus control signal to provide a first signal having a frequency that is a first fraction of the frequency of the output signal, and responsive to the final modulus control signal to provide a second signal having a frequency that is a second fraction of the frequency of the output signal;
a reference signal source to provide a reference signal;
detector means, operate when the ramp signal assumes its initial value to compare the frequency of the reference signal with that of the first signal and to provide an offset correction signal having a value indicative of any difference therebetween, and further operative when the ramp signal assumes its final value to compare the frequency of the reference signal with that of the second signal and to provide a slope correction signal having a value indicative of any difference therebetween;
storage means to store the values of said correction signals;
means to apply the stored offset correction signal value to the summing means; and
means to apply the stored slope correction signal value to the ramp generator.

9. A sweep oscillator comprising:
a timing means;
a ramp generator responsive to the timing means and to a slope correction signal to provide a ramp signal that varies between an initial value and a final value at periodic intervals determined by the timing means, the ramp signal having a slope determined by said correction signal;
summing means operative to add an offset correction signal to the ramp signal to provide an oscillator control signal;
an oscillator responsive to the oscillator control signal to provide an output signal having a frequency determined by said oscillator control signal;
modulus control means responsive to the timing means to provide initial and final modulus control signals corresponding, respectively, to the initial and final values of the ramp signal;
a variable-modulus frequency divider responsive to the initial modulus control signal to provide a first signal having a frequency that is a first fraction of the frequency of the output signal, and responsive to the final modulus control signal to provide a second signal having a frequency that is a second fraction of the frequency of the output signal;
a reference signal source to provide a reference signal;
detector means, operative when the ramp signal assumes its initial value to compare the frequency of the reference signal with that of the first signal and to provide an offset correction signal having a value indicative of any difference therebetween, and further operative when the ramp signal assumes its final value to compare the frequency of the reference signal with that of the second signal and to provide a slope correction signal having a value indicative of any difference therebetween;
storage means to store the values of said correction signals;
means to apply the stored offset correction signal value to the summing means; and
means to apply the stored slope correction signal value to the ramp generator.

10. A sweep oscillator according to claim 9 and further comprising means for an operator to manually select the first and second predetermined frequencies.

11. A sweep oscillator comprising:
a ramp generator responsive to a slope correction signal to provide a ramp signal that varies between an initial value and a final value at periodic intervals, the ramp signal having a slope determined by said slope correction signal;
summing means operative to add an offset correction signal to the ramp signal to provide an oscillator control signal;
an oscillator responsive to the oscillator control signal to provide an output signal having a frequency determined by said oscillator control signal;
modulus control means to provide initial and final modulus control signals corresponding, respectively, to the initial and final values of the ramp signal;
a variable-modulus frequency divider responsive to the initial modulus control signal to provide a first signal having a frequency that is a first fraction of the frequency of the output signal, and responsive to the final modulus control signal to provide a second signal having a frequency that is a second fraction of the frequency of the output signal;
a reference signal source to provide a reference signal;
detector means, operative when the ramp signal assumes its initial value to compare the frequency of the reference signal with that of the first signal and to provide an offset correction signal having a value indicative of any difference therebetween, and further operative when the ramp signal assumes its final value to compare the frequency of the reference signal with that of the second signal and to provide a slope correction signal having a value indicative of any difference therebetween;
offset storage means, operative when the ramp signal assumes its initial value to apply the offset correction signal to the summing means whereby the oscillator control signal is caused to shift the frequency of the output signal toward a first predetermined value, and further operative when the ramp signal begins to change from its initial value towards its final value to store the value of the offset correction signal then being provided by the detector means and then to apply said stored offset correction signal value to the summing means; and
slope storage means, operative when the ramp signal assumes its final value to apply the slope correction signal to the ramp generator whereby the oscillator control signal is caused to shift the frequency of the output signal toward a second predetermned value, and further operative when the ramp signal begins to change from its final value back to its initial value to store the value of the slope correction signal then being provided by the detector means and then to apply said stored slope correction signal value to the ramp generator.

12. A sweep oscillator comprising:

a timing means;

a ramp generator responsive to the timing means and to a slope correction signal to provide a ramp signal that varies between an initial value and a final value at periodic intervals determined by the timing means, the ramp signal having a slope determined by said correction signal;

summing means operative to add an offset correction signal to the ramp signal to provide an oscillator control signal;

an oscillator responsive to the oscillator control signal to provide an output signal having a frequency determined by said oscillator control signal;

modulus control means resonsive to the timing means to provide initial and final modulus control signals corresponding, respectively, to the initial and final values of the ramp signal;

a variable-modulus frequency divider responsive to the initial modulus control signal to provide a first signal having a frequency that is a first fraction of the frequency of the output signal, and responsive to the final modulus control signal to provide a second signal having a frequency that is a second fraction of the frequency of the output signal;

a reference signal source to provide reference signal;

detector means, operative when the ramp signal assumes its initial value to compare the frequency of the reference signal with that of the first signal and to provide an offset correction signal having a value indicative of any difference therebetween, and further operative when the ramp signal assumes its final value to compare the frequency of the reference signal with that of the second signal and to provide a slope correction signal having a value indicative of any difference therebetween:

offset storage means, operative when the ramp signal assumes its initial value to apply the offset correction signal to the summing means whereby the oscillator control signal is caused to shift the frequency of the output signal toward a first predetermined value, and further operative when the ramp signal begins to change from its initial value towards its final value to store the value of the offset correction signal then being provided by the detector means then to apply said stored offset correction signal value to the summing means; and slope storage means, onerative when the ramp signal assumes its final value to apply the slope correction signal to the ramp generator whereby the oscillator control signal is caused to shift the frequency of the output signal toward a second predetermined value, and further operative when the ramp signal begins to change from its final value back to its initial value to store the value of the slope correction signal and then being provided by the detector means and then to apply said stored slope correction signal value to the ramp generator.

13. A sweep oscillator according to claim 12 and further comprising means for an operator to manually select the first and second predetermined frequencies.

14. A method of generating a calibrated sweep signal, comprising:

applying an oscillator control signal having an initial value to an oscillator to provide an output signal having a frequency determined by said control signal;

setting the modulus of a frequency dividier to a first setting;

applying the output signal to the frequency divider to produce a first signal having a frequency that is a first fraction of the frequency of said output signal;

comparing the frist signal with a reference signal;

generating an offset correction signal having a value indicative of any difference between the frequency of the first signal and that of the reference signal;

adding the offset correction signal to the control signal whereby the frequency of the output signal is caused to shift toward a predetermined initial value corresponding with the first setting of the frequency divider modulus;

storing the value of the offset correction signal;

thereafter adding the stored offset correction signal value to the control signal;

changing the control signal at a constant rate from the initial value to a final value;

setting the modulus of the frequency divider to a second value;

applying the output signal to the frequency divider to produce a second signal having a frequency that is a second fraction of the frequency of said output signal:

comparing the second signal with the reference signal;

generating a slope correction signal having a value indicative of any difference between the frequency of the second signal and that of the reference signal;

combining the slope correction signal with the control signal whereby the frequency of the output signal is caused to shift toward a predetermined final value corresponding with the second setting of the frequency divider modulus;

storing the value of the slope correction signal; and thereafter combining the stored slope correction signal value with the control signal.

15. A method according claim 14 and further comprising the steps of changing the oscillator control signal from the final value to the initial value after the slope correction signal has been stored, and then repeating all of the steps of the method.

* * * * *

UNITED STATES PATENT AND TRADEMARK OFFICE
CERTIFICATE OF CORRECTION

PATENT NO. : 4,603,305
DATED : July 29, 1986
INVENTOR(S) : Earl McCune

It is certified that error appears in the above-identified patent and that said Letters Patent is hereby corrected as shown below:

Column 1, line 58, delete "swe" and insert --sweep--;

Column 2, line 9, delete "highprecision" and insert --high-precision--;

Column 3, line 48, delete "set" and insert --sets--;

Column 5, line 65, delete "an" and insert --any--;

Column 8, line 30, delete "6" and insert --1--;

Column 10, line 30, delete "an" and insert --and--;

Column 11, line 26, delete "operate" and insert --operative--;

Column 13, line 56, delete "onerative" and insert --operative--;

Column 13, line 34, after "provide" insert --a--;

Column 14, line 4, after "signal" delete --and--; and

Column 14, line 58 after "signal" insert --value--.

Signed and Sealed this

Fourteenth Day of October, 1986

[SEAL]

*Attest:*

DONALD J. QUIGG

*Attesting Officer*    *Commissioner of Patents and Trademarks*